(12) United States Patent
Straeussnigg et al.

(10) Patent No.: US 11,139,820 B1
(45) Date of Patent: Oct. 5, 2021

(54) EFFICIENT DIGITAL GAIN IMPLEMENTATION IN DIGITAL MICROPHONES

(71) Applicant: Infineon Technologies AG, Neubiberg (DE)

(72) Inventors: Dietmar Straeussnigg, Villach (AT); Florian Brame, Villach (AT); David Andrew Russell, Bernareggio (GB)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/932,010

(22) Filed: Jul. 17, 2020

(51) Int. Cl.
| H03M 1/12 | (2006.01) |
| H03G 3/30 | (2006.01) |
| H04R 3/00 | (2006.01) |
| H04R 19/04 | (2006.01) |
| H03M 1/06 | (2006.01) |
| H03M 1/10 | (2006.01) |

(52) U.S. Cl.
CPC .............. *H03M 1/12* (2013.01); *H03G 3/301* (2013.01); *H04R 3/00* (2013.01); *H04R 19/04* (2013.01); *H03M 1/06* (2013.01); *H03M 1/1009* (2013.01); *H04R 2201/003* (2013.01)

(58) Field of Classification Search
CPC ........ H03M 1/12; H03M 3/30; H03M 1/1009; H03M 1/06
USPC ................................. 341/155, 143, 120, 118
See application file for complete search history.

(56) References Cited

U.S. PATENT DOCUMENTS

| 10,263,582 | B1 * | 4/2019 | Yoo ....................... H03G 1/0035 |
| 2008/0150776 | A1 * | 6/2008 | DiGiandomenico . H03M 3/416 341/143 |
| 2009/0245504 | A1 * | 10/2009 | Wahby ................ H04M 19/001 379/413 |
| 2018/0063644 | A1 * | 3/2018 | Bach ........................ H04R 3/06 |

* cited by examiner

*Primary Examiner* — Joseph J Lauture
(74) *Attorney, Agent, or Firm* — Slater Matsil, LLP

(57) ABSTRACT

A system includes an analog-to-digital converter (ADC) and a digital modulator coupled to the ADC, wherein the digital modulator comprises an output for providing a digital signal, wherein the digital modulator comprises a main signal path and a feedback path, and wherein the feedback path comprises a first digital gain stage having a first adjustable gain range.

21 Claims, 8 Drawing Sheets

EFFICIENT DIGITAL GAIN IMPLEMENTATION IN DIGITAL MICROPHONES

TECHNICAL FIELD

The present invention relates generally to an efficient digital gain implementation in digital microphones, and, in particular embodiments, to a corresponding system, circuit, and method.

BACKGROUND

Microphones are used to transduce ambient noise or sound into electrical signals. Telecommunication applications often use microphones of small scale. An example for a small-scale microphone is a silicon-microphone or a microphone implemented as a micro-electro-mechanical system (MEMS) device. If the MEMS device is a microphone used in conjunction with other digital components, the entire system or assemblage of components may be referred to as a "digital microphone." In order to provide for a good quality of the recorded sound or to comply with customers' requirements, a high linearity, high signal-to-noise ratios (SNR) or the compliance with a predetermined spectral mask for the response function of a microphone may be required. There may be other requirements such as providing multiple gain modes of operation. While existing solutions may adequately comply with customers' requirements and otherwise provide good performance, some applications may be sensitive to power consumption and integrated circuit area of the digital microphone. Some consumer device applications, for example, may be cost sensitive, and so these applications will consequently be sensitive to power consumption and integrated circuit area of the digital microphone. Hence, there is a desire to provide digital microphones with reduced power consumption and integrated circuit area, while maintaining high levels of performance and the ability to comply with all of the customers' requirements.

SUMMARY

In accordance with an embodiment of the present invention, a system comprises an analog-to-digital converter (ADC); and a digital modulator coupled to the ADC, wherein the digital modulator comprises an output for providing a digital signal, wherein the digital modulator comprises a main signal path and a feedback path, and wherein the feedback path comprises a first digital gain stage having a first adjustable gain range.

In another embodiment, a circuit comprises an analog-to-digital converter (ADC); and a digital modulator coupled to the ADC, wherein the digital modulator comprises a main signal path and a feedback path, wherein the feedback path comprises a first digital gain stage, and wherein the ADC and the digital modulator are disposed in a common substrate of a single integrated circuit.

In another embodiment, a method comprises converting an analog signal into a digital signal; and modulating the digital signal with a digital modulator, wherein the digital modulator comprises a main signal path and a feedback path, and wherein the feedback path comprises a digital gain stage having a first adjustable gain range.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENT

Figure 1:
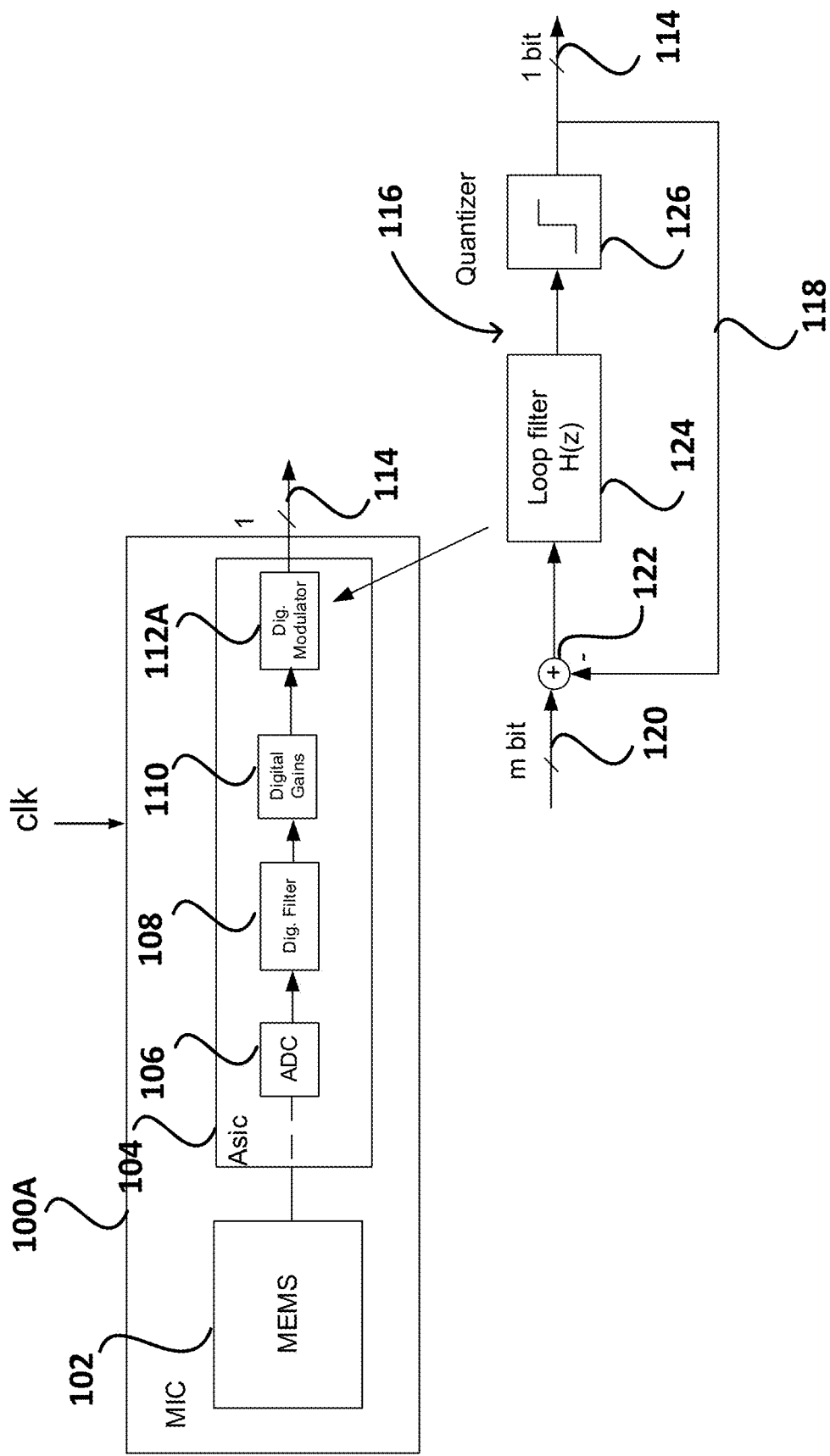
FIG. 1 is a block diagram of an exemplary digital microphone including a detailed block diagram of a digital modulator used in the digital microphone.

In FIG. 1 a block diagram of an exemplary digital microphone 100A is shown. Digital microphone 100A includes a MEMS device 102 and an Application Specific Integrated Circuit (ASIC) 104. The MEMS device 102 may comprise a microphone in an embodiment, which converts external audio signals into an analog output signal and is received by ASIC 104. The ASIC 104 includes an Analog to Digital Converter (ADC) 106 coupled to MEMS device 106, a digital filter 108 coupled to ADC 106, a digital gain block no coupled to digital filter 108, and a digital modulator 112 coupled to digital gain block 110. The digital modulator 112A provides a one bit digital output at output 114, in an example. Digital microphone 110A also includes a clock input for receiving a clock (clk) signal, which may be distributed to one or more components including ADC 106, digital filter 108, digital gains block no, and/or digital modulator 112A.

In operation, the ASIC 104 reads the analog signal output of the MEMS device 102, provides an analog to digital conversion through ADC 106 and further processes the digital signal of ADC 106 through additional processing modules including digital filter 108, digital gain block no, and digital modulator 112A. The digital modulator 112A provides a single bit data stream output depending upon the magnitude of the input signal that may be requested by customers. The digital filter 108 includes, for example, DC voltage removal functionality and low pass filtering. The digital gains block no can include a plurality of digital gain settings to satisfy different customer requirements. Examples include a gain mode for use in calibration of the digital microphone 100A and other gain modes for use in specific operational modes or for reasons of flexibility in the operation of digital microphone 100A.

The digital gains in digital gains block no are typically implemented by using shift and add structures in order to avoid the use of a full digital multiplier (which is inefficient in terms of area and power consumption and thus increases the cost of digital microphone 100A), although a full digital multiplier can be used in certain circumstances. In many digital microphones several different digital gains are needed (gains for calibration of sensitivity, gains for adjustment of acoustic overload point (AOL) levels in different modes, etc.). However, the complexity of one specific digital gain depends on the specific gain value being used. For example, the implementation of the digital gain of −1 dB (0.8906 as a linear value) is realized by adding the fractions ½+¼+⅛+1/64 in calculating the gain coefficient. So in this example, three adders are needed for only one coefficient. More complicated gain coefficients may require the combination of even more fractions. Multiple gain coefficient calculations leads to a significant contribution to power consumption and area, and thus an increase in the corresponding cost of the digital microphone 100A.

FIG. 1 also includes a more detailed block diagram representation of the digital modulator 112A. Digital modulator 112A includes a summer 122 for receiving an "m" bit input signal from digital gains block 120, a main signal path 116, and a feedback path 118 coupled between one bit output 114 and the negative input of summer 122. Main signal path 116 includes a loop filter 124 and a one-bit quantizer 126. Loop filter 124 may comprise a digital low pass filter, in an example. One-bit quantizer 126 provides a single bit output depending upon the input level of the digital output signal of loop filter 124. For example, a positive half cycle of a sine wave input to quantizer 126 will be coded with more positive logic one instances at output 114, whereas a negative half cycle of a sine wave input to quantizer 126 will be coded with fewer positive logic one instances and more negative logic one instances at output 114.

The digital microphone 100A provides all of the gain adjustment in digital gains block 110, which may include shifting and adding circuitry, or multiplication circuitry that can add to the cost of digital microphone 100A for the reasons discussed above. An alternative approach for providing gain adjustment without the shifting and adding circuitry, or reducing the size of the shifting and adding circuitry, while repurposing existing components of the digital microphone, and lowering unit costs is described in detail below.

Figure 2:
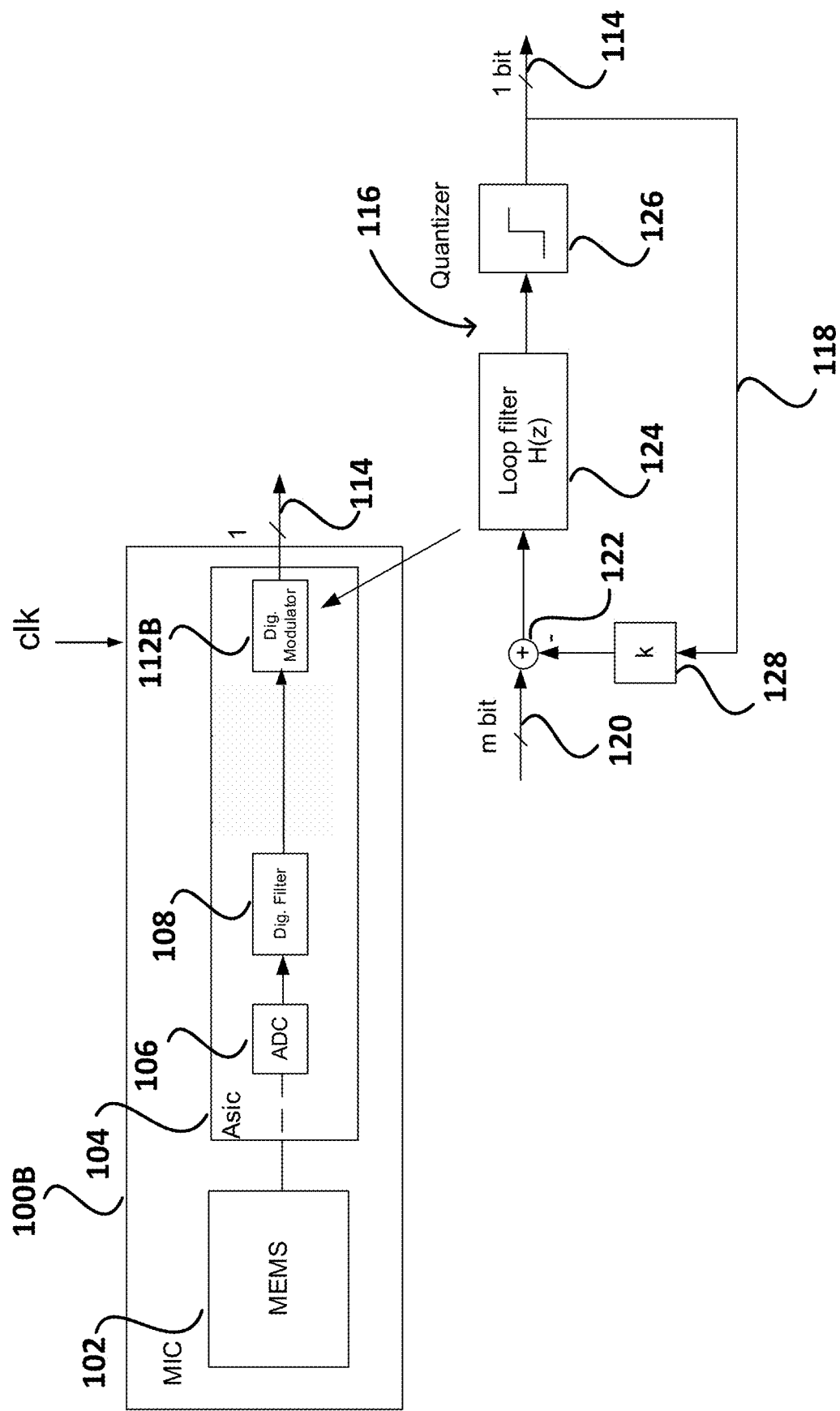
FIG. 2 is a digital microphone with a digital gain adjustment by changing the feedback level in the digital modulator according to an embodiment.
Figure 3:
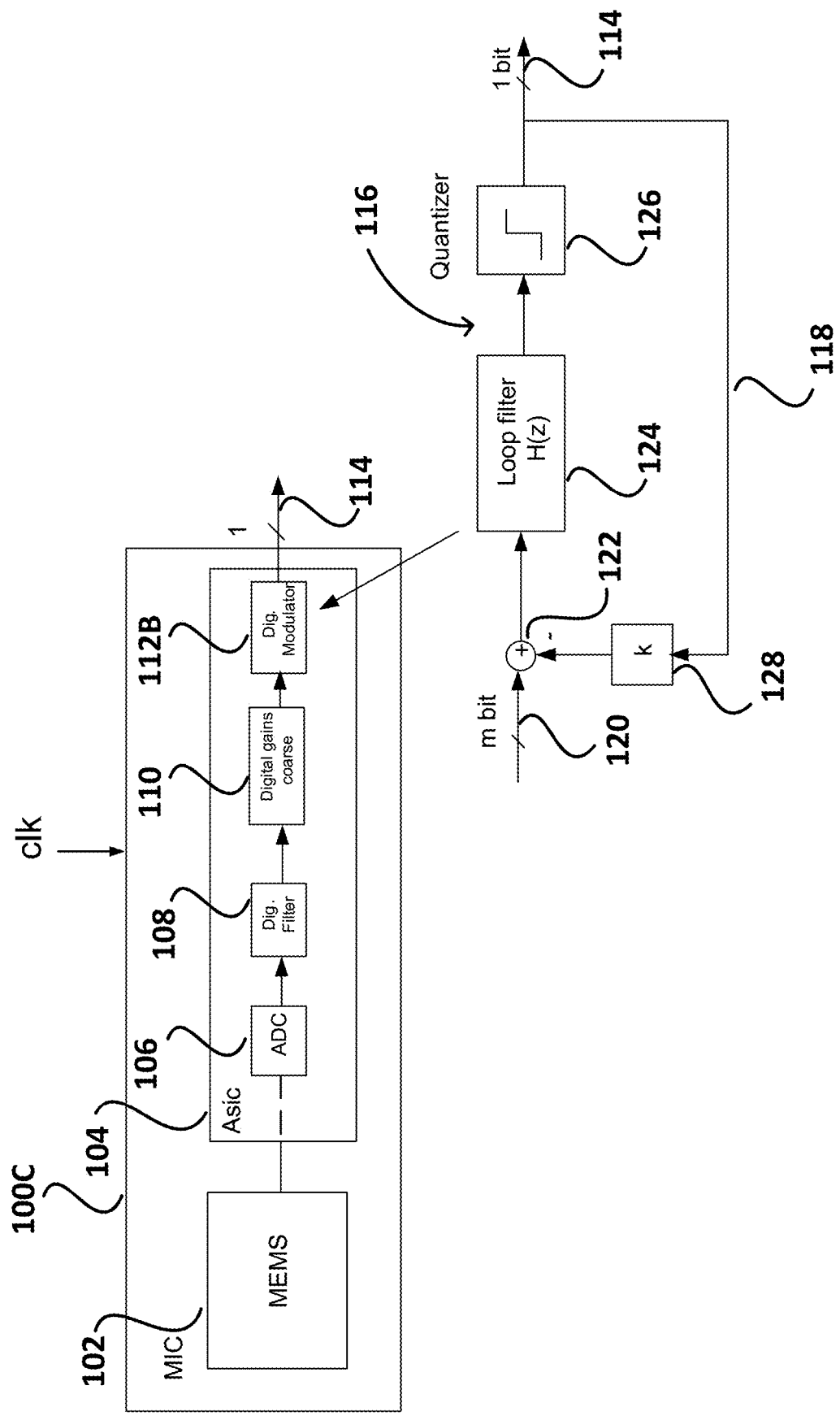
FIG. 3 is a digital microphone with a digital gain adjustment for an expanded gain range (including a combination of changing the feedback level in the digital modulator and including a digital gain block) according to an embodiment.

According to an embodiment, digital gains can be implemented by changing the feedback level of the single bit digital modulator 112B, as depicted in FIG. 2. FIG. 2 shows a digital microphone 100B, including MEMS device 102 and ASIC 104. ASIC 104 includes ADC 106, digital filter 108, and digital modulator 112B, as well as a clk input for receiving an external clock signal. FIG. 3 also shows a detailed block diagram of digital modulator 112B, including summer 122, a main signal path 116 including loop filter 124 and quantizer 126, and a feedback path 118 including digital gain stage 128. As before, digital modulator 112B includes an "m" bit input 120 and a one bit output 114.

The feedback path 118 comprises a constant gain factor "k", which leads to a very cost effective implementation and can be demonstrated to provide an overall gain for digital microphone 100B between the analog input of ADC 106 and the one bit output 114. The implementation of a specific digital gain is realized in embodiments by storing a corresponding digital constant, which is used as the feedback signal in feedback path 118 of the digital modulator 112B. The quantizer 112B output 114 can switch between a positive logic one and a negative logic one as noted above. In the case of a single bit output, the constant gain factor "k" is applied to the positive logic one state and to the negative logic one state as will be explained in further detail below with the lookup table implementation shown in FIG. 6. The quantizer 112B output 114 is configured to switch one bit in a positive direction and one bit in a negative direction. In the case of positive and negative bits at the output of quantizer 126, the constant gain factor "k" is applied both to the positive logic state and the negative logic state.

In an embodiment, constant gain factor "k" can be implemented as a separate digital component comprising digital gain stage 128, or can be implemented as a lookup table that will be described in further detail below, especially with the embodiment shown in FIG. 5. In other embodiments, the digital modulator 112B can be implemented in a microprocessor (best seen in FIG. 7 and FIG. 8) or even in software. In the embodiment of FIG. 2, therefore, the digital gain of digital microphone 100B is provided solely by digital gain stage 128.

In the digital microphone embodiment shown in FIG. 2, the power and silicon area of an integrated circuit microphone are significantly reduced with respect to the digital microphone embodiment of FIG. 1.

If a digital gain adjustment for a larger range is needed, as compared to the digital gain provided by digital gain stage 128, digital microphone 100C as shown in FIG. 3 can be used. Digital gains block no is added in ASIC 104, as depicted in FIG. 3. Digital microphone 100C is thus a combination of standard digital gain implementation ("coarse digital gains") provided by digital gains block no, and the constant gain factor "k" ("fine digital gains" or "fine tuning") provided by digital gain stage 128. The coarse digital gains provided by digital gains block no covers a large gain range needed (which can be implemented more efficiently) and the fine tuning is provided over a smaller gain range with constant gain factor "k" provided by digital gain stage 128. The large gain range is implemented more efficiently because fewer shift and adding structures are needed to implement fewer individual gain level. The fine gains are implemented with digital gain stage 128. In an embodiment, coarse digital gains provided by digital gains block no can range from 0 dB to 12 dB, in steps of 3 dB. In an embodiment, fine digital gains provided by digital gain stage 128 can range from 0 dB to 3 dB, in steps of 0.2 dB. However, different ranges and steps for the coarse digital gains and different ranges and steps for the fine digital gains can be used in different applications.

FIG. 3 thus shows a digital microphone 100C including MEMS device 102, ASIC 104 including ADC 106, digital filter 108, digital gains stage no, and digital modulator 112B, as well as a clk input. Digital modulator 112B includes loop filter 124 and quantizer 126 in the main signal path 116 and digital gain stage 128 in the feedback path 118, as well as summer 122, an "m" bit input 120, and a single bit output 114 as previously described.

Figure 4:
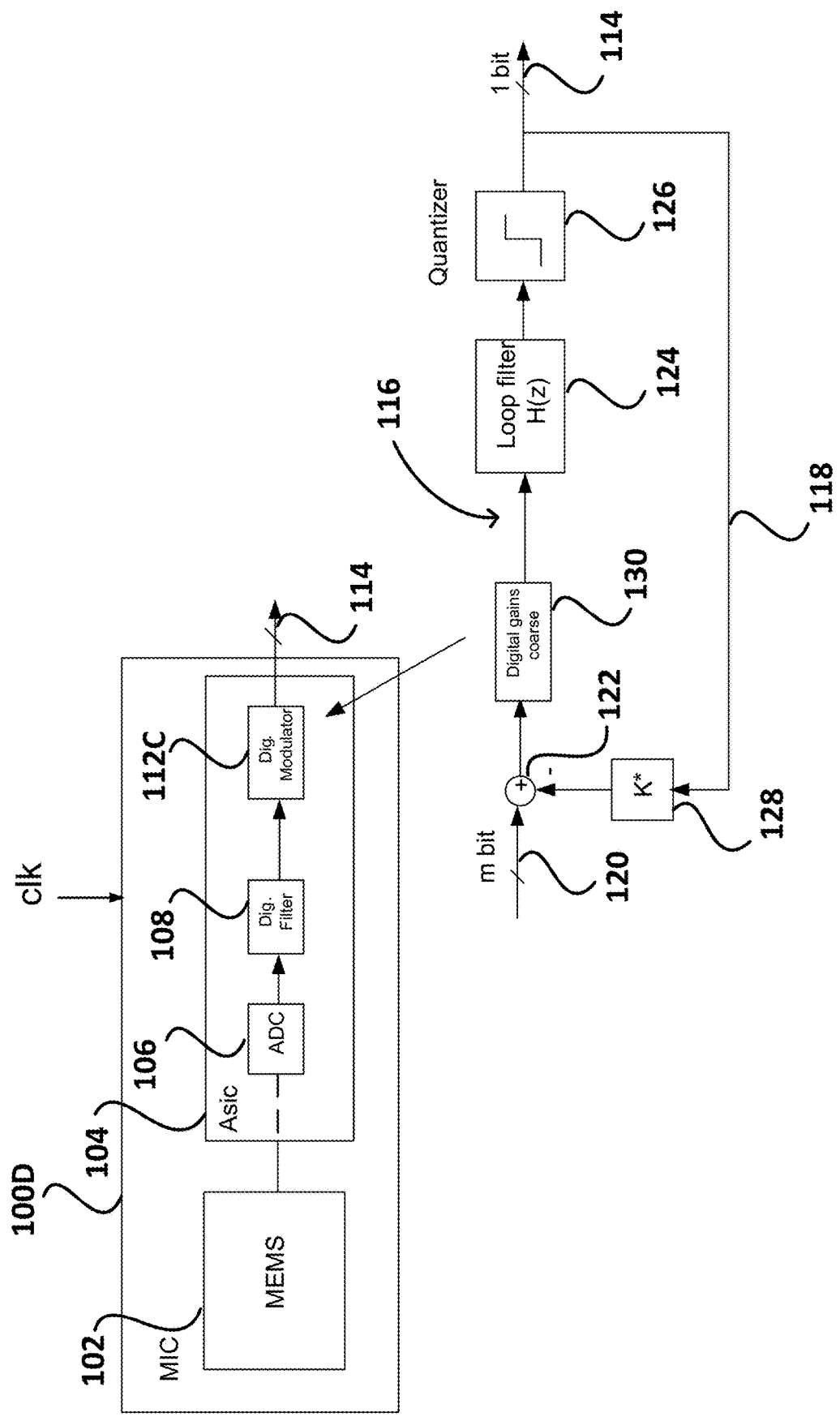
FIG. 4 is a digital microphone with a digital gain adjustment for an expanded gain range (including a combination of changing the feedback level in the feedback path as well as changing the gain level of the main path of the digital modulator)

FIG. 4 shows a block diagram of an implementation of a digital microphone 100D including an additional gain stage 130 in the main signal path of digital modulator 112C, according to an embodiment. Thus, the block diagram of digital microphone 100D is similar to the block diagram of digital microphone 100C shown in FIG. 3. Digital microphone 100D includes a MEMS device 102 and an ASIC 104, wherein the ASIC 104 includes an ADC 106, a digital filter 108, and a modified digital modulator 112C, as well a clk input. Digital modulator 112C includes a main signal path coupled between the output of summer 122 and the one bit output 114. Digital modulator 112C includes a feedback path coupled between one bit output 114 and the negative input of summer 122. The main signal path of digital modulator 112C includes an additional digital gains block 130, which can comprise a coarse gain block, loop filter 124, and quantizer 126. Digital gains block 130 provides a digital gain, defined as providing an output digital word that is a representation of an input digital word times a gain factor, and not a constant value. The feedback path of digital modulator 112C includes a digital gain stage 128, which is also comprises a digital gain factor "K*" that may have a different value from the digital gain factor "k" shown in FIG. 3. This is because the total gain of digital microphone 110D is controlled by both digital gain block 13o, which can comprise coarse gains over a broad range of gains, and digital gain stage 128, which can comprise fine gains over a narrower range of gains.

The digital microphone embodiment shown in FIG. 4 can save at least half of the power and silicon area of the digital microphone embodiment shown in FIG. 1.

Figure 5:
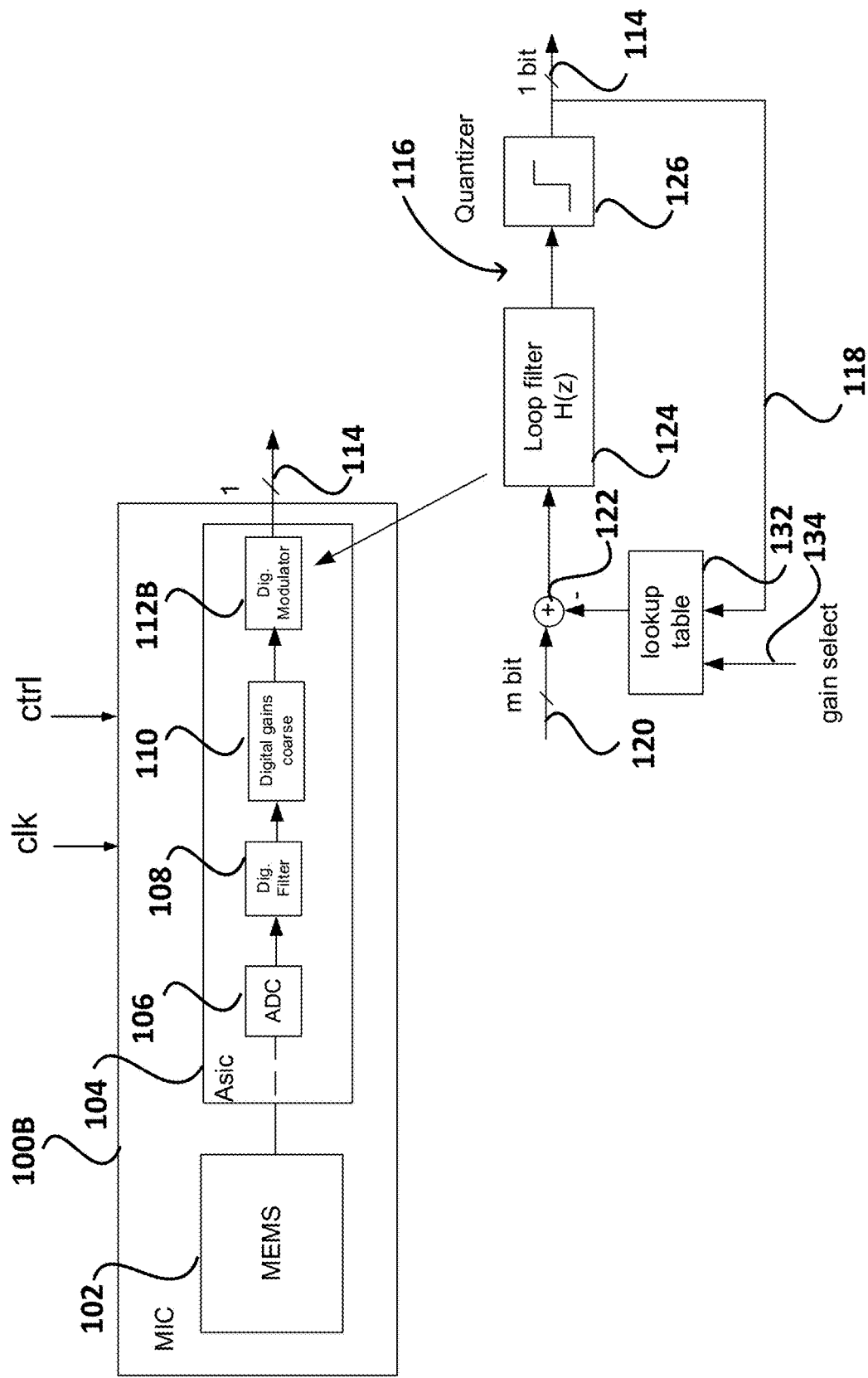
FIG. 5 shows a block diagram of a digital microphone of FIG. 3 wherein the feedback gain block has been implemented with a lookup table.

FIG. 5 shows a block diagram of digital microphone 100B according to an embodiment, using a lookup table 132 to implement digital gain stage 128. Thus, digital microphone includes MEMS device 102 and ASIC 104 as previously described. However, digital modulator 112 has been implemented with lookup table 132 disposed in the feedback path 118 of digital modulator 112B. The main signal path 116 of digital modulator 112B is the same as previously described, including loop filter 124 and quantizer 126. However, the feedback path 118 now includes lookup table 132, which replaces digital gain stage 128. Lookup table includes enough memory to convert the one bit output 114, which is the digital "one" input word to lookup table 132 into the digital gain factor "k", which is an "m" bit output word that is supplied to the negative input of summer 122. Lookup table 132 includes a gain select input 134 that may be used to select between a number of gain modes for digital microphone 100B. In an embodiment, the gain select input 134 may form a part of a control (ctrl) input signal to digital microphone 100B. The control input signal can also be used to control the operational modes of ADC 106, digital filter 108, digital gains block no, as well as digital modulator 112B. The control input signal may be used to, for example, control the accuracy of ADC 106, change the filter coefficients of digital filter 108, or to change the gain mode of the coarse digital gains block no, in embodiments. The control input signal can be a digital bus including one or more digital bits under the control of a microprocessor not shown in FIG. 5. In embodiments, the microprocessor can be integrated together with the digital microphone 100B and/or other components, or can be external to the digital microphone 100B.

Figure 6:
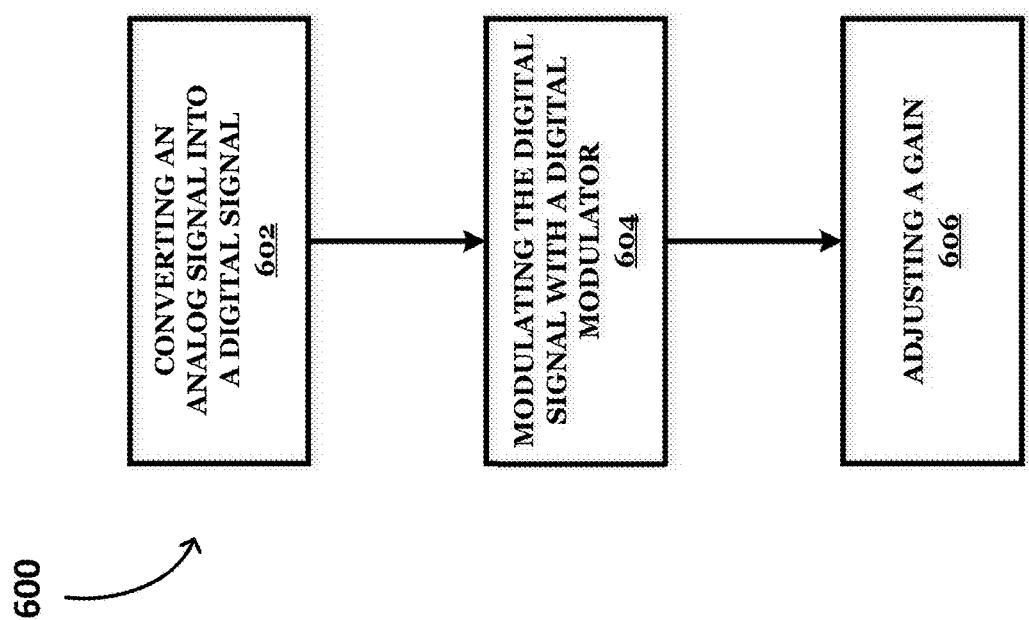
FIG. 6 shows a block diagram of an embodiment method, including a plurality of optional method steps.

FIG. 6 is a block diagram of an embodiment method 600 for operating a digital microphone or digital microphone system, including method steps 602, 604, and 606. Method 600 comprises method step 602 for converting an analog signal into a digital signal; method step 604 for modulating the digital signal with a digital modulator, wherein the digital modulator comprises a main signal path and a feedback path, and wherein the feedback path comprises a digital gain stage having a first adjustable gain range; and method step 606 for adjusting a gain of the digital microphone or digital microphone system. In method 600 the digital modulator can comprise a single-bit digital modulator. In method step 606, a gain of the digital microphone or digital microphone system can comprise digitally scaling an output of the digital gain stage to provide a scaled output signal, and subtracting the scaled output signal from the digital signal. In method step 606, a gain of the digital microphone or digital microphone system can comprise increasing an amplitude of the digital signal using a second adjustable gain range greater than the first adjustable gain range. In method step 606, a gain of the digital microphone or digital microphone can comprise increasing an amplitude of a signal in the main signal path of the digital modulator using a second adjustable gain range greater than the first adjustable gain range. The above gain adjustment variations of method step 606 can be combined in embodiments. The digital signal of method 600 can comprise a filtered digital signal in embodiments. Method 600 is not limited to the method steps 602, 604, and 606 shown in FIG. 6 and may comprise additional steps performed in various sequences.

Figure 7:
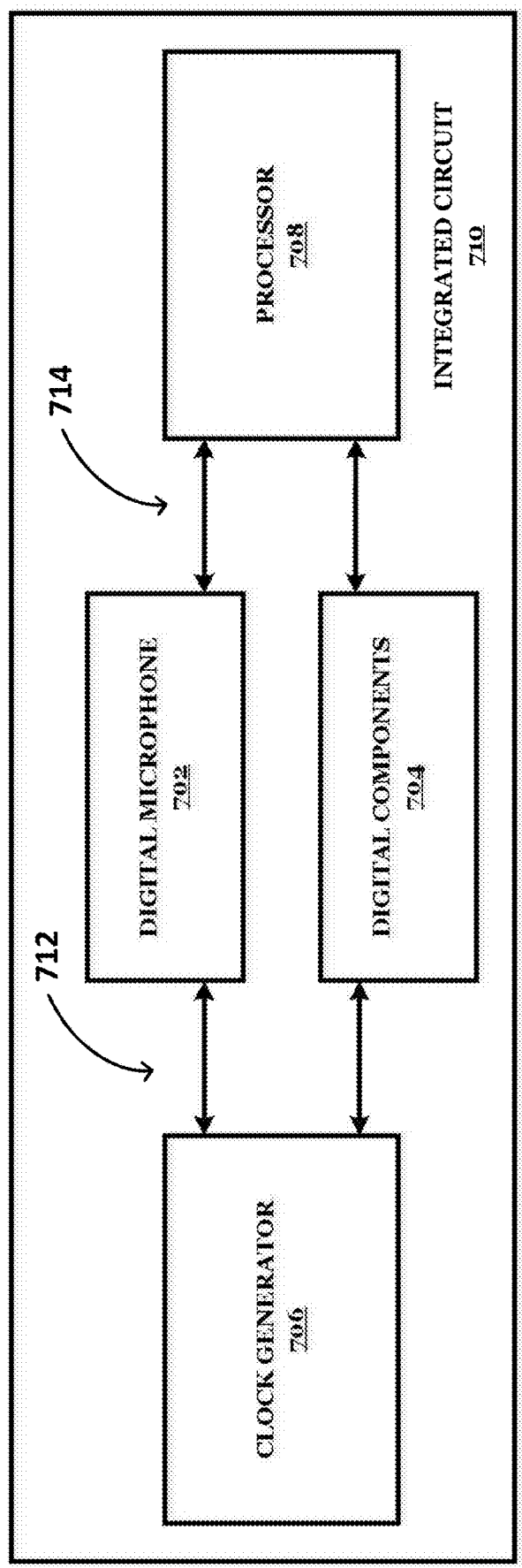
FIG. 7 shows a digital microphone system according to an embodiment, including a processor and clock generator.

FIG. 7 is a block diagram of a digital microphone system integrated on one or more integrated circuits 710. Digital microphone 702 can be integrated together on a common substrate with one or more digital components 704 or other MEMS devices, together with a clock generator 706 and a processor 708. Clock generator 706 generates one or more clock signals 712 for digital microphone 702 and other digital components 704. Processor 708 generates one or more control signals for digital microphone 702 and digital components 704. In embodiments, clock generator 706 is coupled to digital microphone 702 and digital components 704 via one or more bi-directional digital buses. In embodiments, processor 708 is coupled to digital microphone 702 and digital components 704 via one or more bi-directional digital buses. In other embodiments, clock generator 706 and/or processor 708 can be external to integrated circuit 710. Integrated circuit 710 can comprise a hybrid circuit including a common substrate interconnecting other components and integrated circuits.

Figure 8:
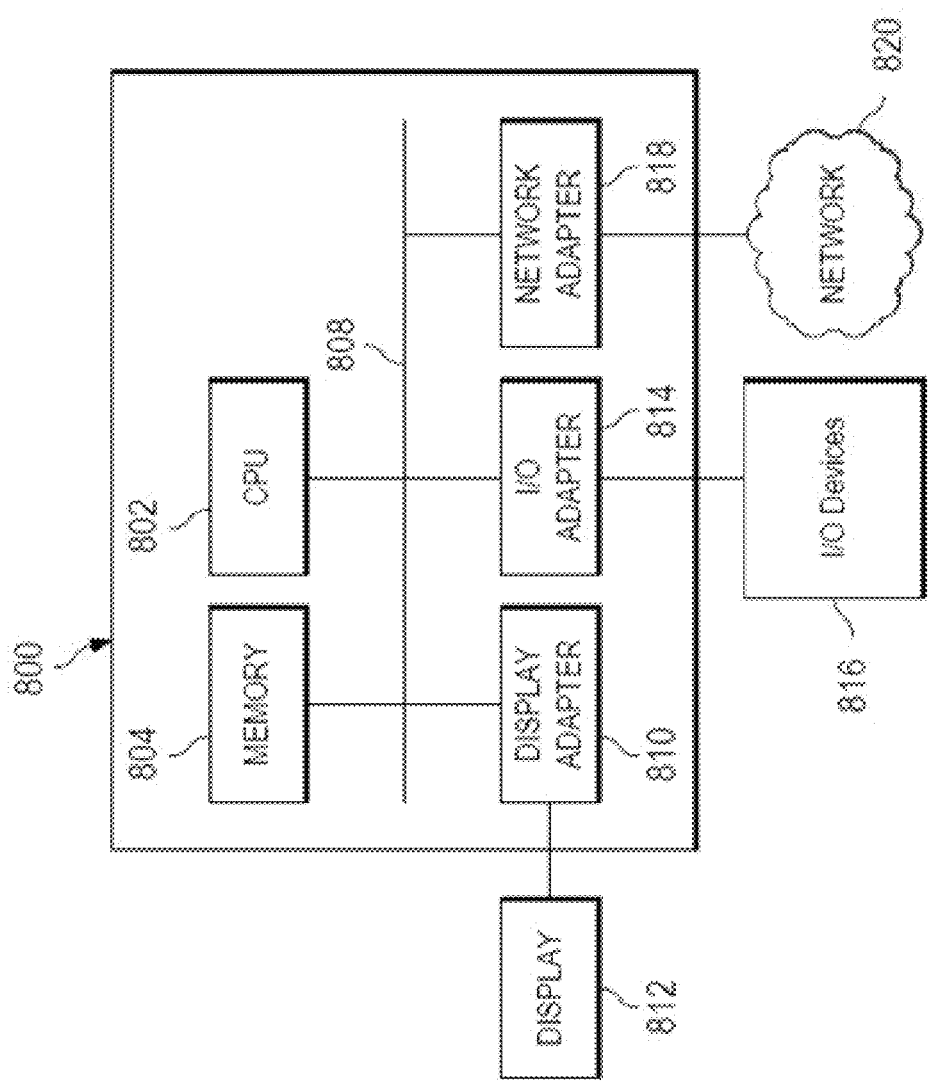
FIG. 8 shows a block diagram of a processing system in accordance with an embodiment of the present invention.

Referring now to FIG. 8, a block diagram of a processing system 800 that can be used for processor 708 shown in FIG. 7 is provided in accordance with an embodiment of the present invention. The processing system 800 depicts a general-purpose platform and the general components and functionality that may be used to implement portions of a digital microphone or digital microphone system and/or an external computer or processing device interfaced to a digital microphone system. For example, processing system 800 may be used to implement processor 708 and/or clock generator 706 shown in FIG. 7. In some embodiments, processing system 800 may be used to provide a control signal for changing gain modes of one or more gain stages in a digital microphone system as well as changing filter coefficients in a digital filter of a digital microphone system. In addition, processing system 800 may be used to provide a control signal for changing the operational mode of an ADC of a microphone system.

Processing system 800 may include, for example, a central processing unit (CPU) 802, and memory 804 connected to a bus 808, and may be configured to perform the processes described above. In some embodiments, memory 804 may be used to implement memory of lookup table 132 shown in FIG. 5. Alternatively, the memory of lookup table 132 may be separate from memory 804. In some embodiments, memory 804 may be used to store filter coefficients for digital filter 108 shown in FIG. 2, FIG. 3, and FIG. 4. Alternatively, the filter coefficients may be stored locally apart from memory 804. The processing system 800 may further include, if desired or needed, a display adapter 810 to provide connectivity to a local display 812 and an input-output (I/O) Adapter 814 to provide an input/output interface for one or more input/output devices 816, such as a mouse, a keyboard, flash drive or the like.

The processing system 800 may also include a network interface 818, which may be implemented using a network adaptor configured to be coupled to a wired link, such as a network cable, USB interface, or the like, and/or a wireless/ cellular link for communications with a network 820. The network interface 818 may also comprise a suitable receiver and transmitter for wireless communications. It should be noted that the processing system 800 may include other components. For example, the processing system 800 may include hardware components power supplies, cables, a motherboard, removable storage media, cases, and the like if implemented externally. These other components, although not shown, are considered part of the processing system 800. In some embodiments, processing system 800 may be implemented on a single monolithic semiconductor integrated circuit and/or on the same monolithic semiconductor integrated circuit as other disclosed system components.

According to embodiments, digital gains for a digital microphone are implemented by changing the feedback level of an existing digital modulator. In an embodiment, the feedback level is accomplished by selecting a constant value from a lookup table and thus no adders or shifters are involved. This, in turn, leads to a significant savings in silicon area and power, which reduces product cost.

It is an advantage that minimal additional power is consumed in the existing digital modulator of the digital microphone, according to embodiments.

It is a further advantage that arbitrary accuracy is possible with almost no additional effort (due to the use of lookup table 132). This fine tuning may be used for sensitivity calibration of the digital microphone (due to variations in fabrication and analog circuit implementation).

In embodiments, digital gains can be provided by a combination of digital gain blocks no and 128, 130 and 128, or even 110, 130, and 128 if desired. In embodiments, ADC 106 can comprise a sigma-delta analog-to-digital converter. In embodiments a sampling rate of up to 3 MHz may be used, with a corresponding clock signal frequency of up to 3 MHz. In embodiments digital filter 108 can comprise a programmable digital filter having a variety of different filter configurations, for example a decimation filter configuration or an offset compensation filter configuration. While examples of the other components of embodiment digital microphones have been shown and described, it will be apparent to those skilled in the art that other examples of these components can also be used. While specific gain range examples have been previously described, other gain ranges can be used in embodiments.

ASIC 104 shown in FIG. 2, FIG. 3, and FIG. 4, as well as integrated circuit 710 shown in FIG. 7 can be implemented on a semiconductor substrate, such as a silicon substrate. In some embodiments, the circuits might be implemented on a single, monolithic semiconductor substrate using, for example, a Complementary Metal Oxide Semiconductor (CMOS) fabrication technology using N-channel (NMOS) and P-channel (PMOS) transistor devices. Embodiments of the present invention may be implemented in other technologies using other device types. For example, Junction Field Effect Transistor (JFETs) and/or bipolar junction transistors (BJTs) may be used in place of MOS devices. Discrete devices or a combination of discrete devices and integrated circuit devices may also be used in embodiments.

In embodiments, for example the embodiment of digital microphone 100D shown in FIG. 4, the digital gains coarse block 130 may be combined with the loop filter 124, so that a merged loop filter 124 provides the gain function using only changed filter coefficients with respect to the unmerged embodiment.

Example embodiments of the present invention are summarized here. Other embodiments can also be understood from the entirety of the specification and the claims filed herein.

Example 1. According to an embodiment, a system comprises an analog-to-digital converter (ADC); and a digital modulator coupled to the ADC, wherein the digital modulator comprises an output for providing a digital signal, wherein the digital modulator comprises a main signal path and a feedback path, and wherein the feedback path comprises a first digital gain stage having a first adjustable gain range.

Example 2. The system of Example 1, further comprising a second digital gain stage having a second adjustable gain range interposed between the ADC and the digital modulator, wherein the second adjustable gain range is larger than the first adjustable gain range.

Example 3. The system of any of the above examples, further comprising a second digital gain stage having a second adjustable gain range in the main signal path of the digital modulator, wherein the second adjustable gain range is larger than the first adjustable gain range.

Example 4. The system of any of the above examples, wherein the first digital gain stage comprises a lookup table having a gain select input.

Example 5. The system of any of the above examples, wherein the main signal path of the digital modulator comprises a first digital filter and a quantizer.

Example 6. The system of any of the above examples, wherein the digital modulator comprises a single-bit digital output.

Example 7. The system of any of the above examples, wherein the digital modulator is configured for receiving an "m" bit input signal, wherein "m" is an integer greater than one.

Example 8. The system of any of the above examples, wherein the first digital gain stage is configured to map the single-bit output of the modulator to an "m" bit feedback signal.

Example 9. The system of any of the above examples, further comprising an adder having a positive input configured for receiving the "m" bit input signal and a negative input coupled to the "m" bit feedback signal.

Example 10. The system of any of the above examples, further comprising a second digital filter interposed between the ADC and the digital modulator.

Example 11. The system of any of the above examples, further comprising a microelectromechanical system (MEMS) device having an output coupled to the ADC.

Example 12. According to an embodiment, a circuit comprises an analog-to-digital converter (ADC); and a digital modulator coupled to the ADC, wherein the digital modulator comprises a main signal path and a feedback path, wherein the feedback path comprises a first digital gain stage, and wherein the ADC and the digital modulator are disposed in a common substrate of a single integrated circuit.

Example 13. The circuit of Example 12, further comprising a second digital gain stage interposed between the ADC and the digital modulator.

Example 14. The circuit of any of the above examples, further comprising a second digital gain stage in the main signal path of the digital modulator.

Example 15. The circuit of any of the above examples, wherein the first digital gain stage comprises a lookup table having a gain select input.

Example 16. The circuit of any of the above examples, further comprising a digital filter interposed between the ADC and the digital modulator.

Example 17. According to an embodiment, a method comprises converting an analog signal into a digital signal; and modulating the digital signal with a digital modulator, wherein the digital modulator comprises a main signal path and a feedback path, and wherein the feedback path comprises a digital gain stage having a first adjustable gain range.

Example 18. The method of Example 17, wherein the digital modulator comprises a single-bit digital modulator.

Example 19. The method of any of the above examples, further comprising digitally scaling an output of the digital gain stage to provide a scaled output signal, and subtracting the scaled output signal from the digital signal.

Example 20. The method of any of the above examples, further comprising increasing an amplitude of the digital signal using a second adjustable gain range greater than the first adjustable gain range.

Example 21. The method of any of the above examples, further comprising increasing an amplitude of a signal in the main signal path of the digital modulator using a second adjustable gain range greater than the first adjustable gain range.

Example 22. The method of any of the above examples, wherein the digital signal comprises a filtered digital signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
an analog-to-digital converter (ADC); and
a digital modulator coupled to the ADC, wherein the digital modulator comprises an output for providing a digital signal, wherein the digital modulator comprises a main signal path coupled between an input of the digital modulator and the output of the digital modulator and a digital feedback path coupled between the output of the digital modulator and an input summer of the main signal path, and wherein the digital feedback path comprises a first digital gain stage having a first adjustable gain range.

2. The system of claim 1, further comprising a second digital gain stage having a second adjustable gain range interposed between the ADC and the digital modulator, wherein the second adjustable gain range is larger than the first adjustable gain range.

3. The system of claim 1, further comprising a second digital gain stage having a second adjustable gain range in the main signal path of the digital modulator, wherein the second adjustable gain range is larger than the first adjustable gain range.

4. The system of claim 1, wherein the first digital gain stage comprises a lookup table having a gain select input.

5. The system of claim 1, wherein the main signal path of the digital modulator comprises a first digital filter and a quantizer.

6. The system of claim 5, further comprising a second digital filter interposed between the ADC and the digital modulator.

7. The system of claim 1, wherein the digital modulator comprises a single-bit digital output.

8. The system of claim 7, wherein the digital modulator is configured for receiving an "m" bit input signal, wherein "m" is an integer greater than one.

9. The system of claim 8, wherein the first digital gain stage is configured to map the single-bit digital output of the digital modulator to an "m" bit feedback signal.

10. The system of claim 9, further comprising an adder having a positive input configured for receiving the "m" bit input signal and a negative input coupled to the "m" bit feedback signal.

11. The system of claim 1, further comprising a microelectromechanical system (MEMS) device having an output coupled to the ADC.

12. A circuit comprising:
an analog-to-digital converter (ADC); and
a digital modulator coupled to the ADC, wherein the digital modulator comprises a main signal path coupled between an input of the digital modulator and an output of the digital modulator and a digital feedback path coupled between the output of the digital modulator and an input summer of the main signal path, wherein the digital feedback path comprises a first digital gain stage, and wherein the ADC and the digital modulator are disposed in a common substrate of a single integrated circuit.

13. The circuit of claim 12, further comprising a second digital gain stage interposed between the ADC and the digital modulator.

14. The circuit of claim 12, further comprising a second digital gain stage in the main signal path of the digital modulator.

15. The circuit of claim 12, wherein the first digital gain stage comprises a lookup table having a gain select input.

16. The circuit of claim 12, further comprising a digital filter interposed between the ADC and the digital modulator.

17. A method comprising:
converting an analog signal into a digital signal;
modulating the digital signal with a digital modulator, wherein the digital modulator comprises a main signal path and a feedback path, and wherein the feedback path comprises a digital gain stage having a first adjustable gain range; and
increasing an amplitude of the digital signal using a second adjustable gain range greater than the first adjustable gain range.

18. The method of claim 17, wherein the digital modulator comprises a single-bit digital modulator.

19. The method of claim 17, further comprising digitally scaling an output of the digital gain stage to provide a scaled output signal, and subtracting the scaled output signal from the digital signal.

20. The method of claim 17, wherein the digital signal comprises a filtered digital signal.

21. A method comprising:
converting an analog signal into a digital signal;
modulating the digital signal with a digital modulator, wherein the digital modulator comprises a main signal path and a feedback path, and wherein the feedback path comprises a digital gain stage having a first adjustable gain range; and
increasing an amplitude of a signal in the main signal path of the digital modulator using a second adjustable gain range greater than the first adjustable gain range.

* * * * *